United States Patent
Lischeck et al.

(10) Patent No.: US 8,885,343 B2
(45) Date of Patent: Nov. 11, 2014

(54) HEAT DISSIPATION FROM A CONTROL UNIT

(75) Inventors: Andre Lischeck, Vaihingen/Enz (DE); Thomas Wiesa, Vaihingen (DE)

(73) Assignee: Robert Bosch GmbH, Stuttgart (DE)

( * ) Notice: Subject to any disclaimer, the term of this patent is extended or adjusted under 35 U.S.C. 154(b) by 389 days.

(21) Appl. No.: 13/003,749

(22) PCT Filed: Jun. 17, 2009

(86) PCT No.: PCT/EP2009/057524
§ 371 (c)(1),
(2), (4) Date: May 2, 2011

(87) PCT Pub. No.: WO2010/006869
PCT Pub. Date: Jan. 21, 2010

(65) Prior Publication Data
US 2011/0205711 A1    Aug. 25, 2011

(30) Foreign Application Priority Data
Jul. 17, 2008    (DE) .......................... 10 2008 040 501

(51) Int. Cl.
*H05K 7/20* (2006.01)
*H05K 1/00* (2006.01)
*H01J 5/00* (2006.01)
*F28F 7/00* (2006.01)

(52) U.S. Cl.
CPC ................................. *H05K 7/20454* (2013.01)
USPC ........... 361/715; 361/717; 361/718; 361/719; 361/720; 361/704; 165/80.2; 174/50; 174/252; 257/706; 257/712

(58) Field of Classification Search
CPC ............ H01L 23/4093; H01L 23/4006; H01L 23/467; H01L 23/3672; H01L 2023/405; H01L 2924/14; H01L 2924/01079; H05K 1/0206; H05K 3/0061
USPC ................. 361/704, 715, 717–720; 165/80.2; 257/706, 712; 174/50, 252
See application file for complete search history.

(56) References Cited

U.S. PATENT DOCUMENTS 4,707,763 A * 11/1987 Kudo ............................. 361/720
4,843,520 A * 6/1989 Nakatani et al. ............... 361/739
(Continued)

FOREIGN PATENT DOCUMENTS

DE 4228818 A1 * 3/1994 ............... H05K 5/02
DE 10141697 3/2003
(Continued)

OTHER PUBLICATIONS

International Search Report, PCT International Patent Application No. PCT/EP2009/057524, dated Oct. 23, 2009.

*Primary Examiner* — Bradley Thomas
(74) *Attorney, Agent, or Firm* — Kenyon & Kenyon LLP

(57) ABSTRACT

A control unit, in particular for a motor vehicle, the control unit having a housing, which has at least one heat dissipating area in which at least one electrical and/or electronic module having at least one heat dissipating element is situated, it being provided that the heat dissipating element is heat conductively connected to the heat dissipating area via a heat conducting medium which is introduced into the interior of the housing through at least one housing opening and which has a paste-like consistency, at least when introduced. A corresponding method for manufacturing a control unit is also described.

7 Claims, 5 Drawing Sheets

(56) References Cited

U.S. PATENT DOCUMENTS

| | | | |
|---|---|---|---|
| 5,243,131 A * | 9/1993 | Jakob et al. | 174/536 |
| 5,461,256 A * | 10/1995 | Yamada et al. | 257/679 |
| 5,623,394 A * | 4/1997 | Sherif et al. | 361/705 |
| 5,711,271 A * | 1/1998 | Schlagmueller et al. | 123/339.24 |
| 6,084,776 A * | 7/2000 | Cuntz et al. | 361/707 |
| 6,094,349 A * | 7/2000 | Fassel et al. | 361/704 |
| 6,275,381 B1 * | 8/2001 | Edwards et al. | 361/717 |
| 6,392,890 B1 | 5/2002 | Katchmar | |
| 6,724,627 B2 * | 4/2004 | Onizuka et al. | 361/704 |
| 6,924,985 B2 * | 8/2005 | Kawakita et al. | 361/715 |
| 7,023,699 B2 * | 4/2006 | Glovatsky et al. | 361/704 |
| 7,151,674 B2 * | 12/2006 | Sasaki et al. | 361/752 |
| 7,417,873 B2 * | 8/2008 | Kadoya et al. | 361/797 |
| 7,445,455 B2 * | 11/2008 | Yokozuka et al. | 439/55 |
| 2003/0173059 A1 | 9/2003 | Edelmann | |
| 2004/0160731 A1 * | 8/2004 | Yamaguchi | 361/600 |
| 2004/0223304 A1 * | 11/2004 | Kobayashi et al. | 361/715 |
| 2004/0233640 A1 * | 11/2004 | Itabashi et al. | 361/704 |
| 2005/0000726 A1 * | 1/2005 | Kimata et al. | 174/256 |
| 2005/0068750 A1 * | 3/2005 | Origlia | 361/752 |
| 2005/0088826 A1 * | 4/2005 | Throum | 361/719 |
| 2006/0171127 A1 * | 8/2006 | Kadoya et al. | 361/752 |
| 2006/0181859 A1 * | 8/2006 | Thorum | 361/719 |
| 2007/0134951 A1 * | 6/2007 | Inagaki et al. | 439/74 |
| 2007/0230137 A1 * | 10/2007 | Inagaki | 361/719 |
| 2008/0180916 A1 * | 7/2008 | Wickett | 361/720 |
| 2008/0294324 A1 * | 11/2008 | Yoshinari et al. | 701/102 |
| 2009/0032298 A1 * | 2/2009 | Hayakawa et al. | 174/260 |
| 2009/0057006 A1 * | 3/2009 | Kishibata et al. | 174/521 |
| 2009/0262503 A1 * | 10/2009 | Kaneko et al. | 361/706 |
| 2010/0202110 A1 * | 8/2010 | Becker et al. | 361/707 |

FOREIGN PATENT DOCUMENTS

| | | |
|---|---|---|
| DE | 102005048097 A1 * | 4/2007 |
| JP | 6-349291 | 12/1994 |
| JP | 2000-77869 | 3/2000 |
| JP | 2004-274018 | 9/2004 |
| JP | 2005-117741 | 4/2005 |
| WO | WO 01/58231 | 8/2001 |
| WO | WO 2006/109206 | 10/2006 |

* cited by examiner (A-A)

(A-A)

(A-A)

HEAT DISSIPATION FROM A CONTROL UNIT

FIELD OF THE INVENTION

The present invention relates to a control unit, in particular for a motor vehicle, the control unit having a housing, which has at least one heat dissipating area, in which at least one electrical and/or electronic module having at least one heat dissipating element is situated.

BACKGROUND INFORMATION

German Patent Application No. DE 101 41 697 describes a control unit having a printed circuit board which has a heat dissipating electrical component. The electrical component is cooled due to the fact that it is able to dissipate its heat to a housing surrounding the printed circuit board. For this purpose, the housing is provided with an area capable of dissipating heat. To achieve heat dissipation, the printed circuit board is placed in physical contact with the heat conducting area.

Physical contact of this type may give rise to undefined air gaps between the printed circuit board and the housing, which hinders an optimum heat conducting connection.

SUMMARY

According to an example embodiment of the present invention, the heat dissipating element is heat conductively connected to the heat dissipating area via a heat conducting medium which is introduced into the interior of the housing through at least one housing opening and which has a paste-like consistency, at least when introduced, thereby achieving that an air gap or a space between the heat dissipating element and the heat dissipating area is filled in. This establishes an optimum heat conducting connection between the module and the housing. Due to the housing opening, it is possible to introduce the heat conducting medium at points within the housing which may be reached only with difficulty from the outside during manufacturing. The design of the housing opening is dependent on the heat conducting medium used and on the geometry of the heat dissipating element and the heat dissipating area. In particular, a circular housing opening or a housing opening shaped like an oblong hole is possible. Furthermore, it may be provided that the paste-like heat conducting medium is cured after being introduced, so that the housing opening is tightly sealed. In this way, it is possible to implement the advantages of the present invention in a sealed housing for the control unit. In addition, the use of the paste-like heat conducting medium provides the advantage that both small air gaps and larger spaces between the heat dissipating element and the heat dissipating area may be filled in and thus optimally overcome for heat conducting purposes. The result is high flexibility in designing and manufacturing the control unit, while maintaining the optimum heat conducting connection.

According to a refinement of the present invention, it is provided that the heat conducting medium fills a gap space which forms a portion of the free housing interior and is located between the heat dissipating element and the heat dissipating area. The heat conducting medium is situated only locally, i.e., only in areas of the housing interior, and it does not fill the entire housing interior. The local positioning of the heat conducting medium enables a fast, efficient and resource-saving implementation of optimum heat dissipation during manufacture of the control unit.

According to a particularly advantageous refinement of the present invention, it is provided that the housing is a rack mount housing into which the module is inserted. In this case, it is provided that the module is inserted into the rack mount housing during manufacturing. Inserting the rack mount housing into a corresponding apparatus is not provided. Since it is particularly difficult to establish an optimum thermal connection between the inserted module and the housing in a rack mount housing, the present invention is particularly advantageous in this regard. This is based on the fact that it is not possible to check whether the heat dissipating element is in optimum physical contact with the heat dissipating area after the module has been inserted. Introducing the paste-like heat conducting medium before the module has been inserted results in the heat conducting medium being displaced by the housing and/or by the module when the module is inserted, which impairs the quality of the heat conducting connection. It is frequently no longer possible to introduce the heat conducting medium after the module has been inserted, since the module typically has a housing seal which is connected to the housing when the module is inserted and which seals the housing. The present invention enables an optimum heat conducting connection to be established also in the rack mount housing.

According to a refinement of the present invention, it is provided that the control unit has a guide for inserting the module. The use of a guide makes it possible to easily and securely insert the module into the housing and to fix and support the module within the rack mount housing.

According to a refinement of the present invention, it is provided that the heat dissipating element extends into the guide. This refinement makes it possible to convey heat from the module to the heat dissipating area of the housing via the heat dissipating element with the aid of the guide.

According to a refinement of the present invention, it is provided that the guide is located in the zone of the heat dissipating area. This enables the heat to be dissipated directly into the guides.

According to a refinement of the present invention, it is provided that the guide is designed as a guide channel. The guide channel preferably has a U-shaped cross section and thus surrounds the component on three sides at least in some areas, whereby the component is supported and secured in three directions.

According to a refinement of the present invention it is provided that a section of the housing forms the guide channel. In this design, it is particularly advantageous that a separate guide channel does not have to be introduced into the housing, but instead the rack mount housing is designed in such a way that it forms the guide channel itself. For example, corresponding wall contours of the housing, which form the guide channel, may be provided for this purpose.

According to a refinement of the present invention, it is provided that the guide channel is provided with at least one indentation for clamping the module on its edge. By indenting the guide channel, the component is clamped and fixed in place within the guide channel. This produces good heat dissipation due to a more pronounced physical contact, which is optimized by introducing the heat conducting medium.

According to a refinement of the present invention, it is provided that the module has a printed circuit board which is accommodated in the guide channel. Designing the module as a printed circuit board enables the module to be easily guided with the aid of the guide. In particular, it may be provided that heat dissipating elements which have a flat shape are situated on the printed circuit board.

The present invention also relates to a method for manufacturing a control unit, in particular according to the preceding description, in particular for a motor vehicle, the control unit having a housing which has at least one heat dissipating area in which at least one electrical and/or electronic module having at least one heat dissipating element is situated, the heat dissipating element being heat conductively connected to the heat dissipating area via a heat conducting medium which is introduced into the housing interior through at east one housing opening and which has a paste-like consistency, at least when introduced.

BRIEF DESCRIPTION OF THE DRAWINGS

The figures illustrate the present invention on the basis of exemplary embodiments.

DETAILED DESCRIPTION OF EXAMPLE EMBODIMENTS

Figure 1:
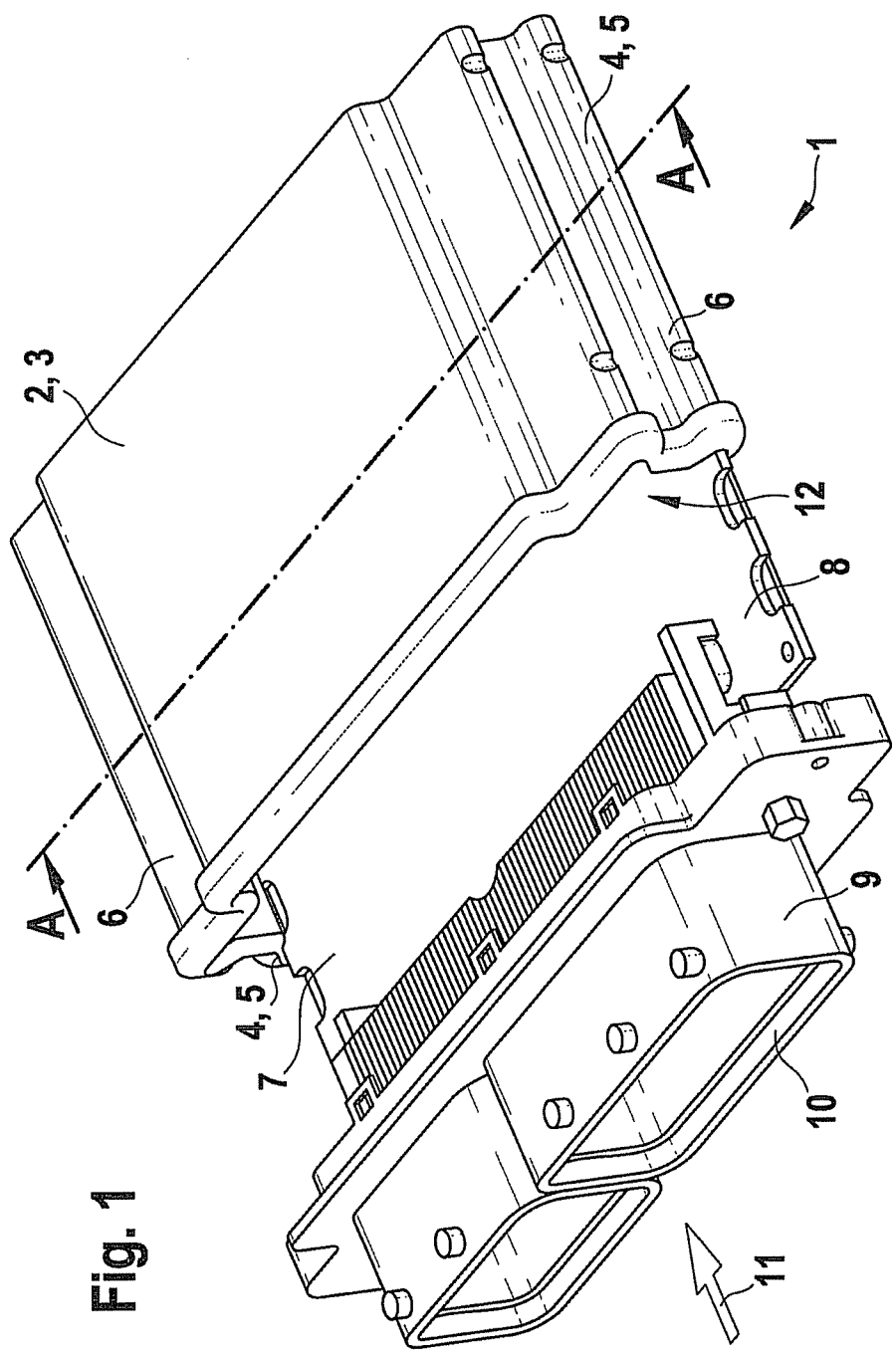
FIG. 1 shows a control unit having a rack mount housing.

FIG. 1 shows a control unit 1 of a motor vehicle. Control unit 1 has a housing 2, which is designed as a rack mount housing 3. Rack mount housing 3 is made of aluminum to enable heat dissipation. Furthermore, rack mount housing 3 has two guides 4, which extend in the parallel direction. Guides 4 are designed as guide channels 5 which have a U-shaped cross section whose openings face each other. Guide channels 5 are formed by a section 6 of housing 2. An electronic module 7 is inserted into rack mount housing 3. Module 7 is designed as a printed circuit board 8. Printed circuit board 8 is provided with a plug link 9, which is used as a rack mount housing seal 10. Printed circuit board 8 lies within guide channels 5 in some areas, so that printed circuit board 8 is insertable into interior 12 of housing 2 in the direction of an arrow 11.

To manufacture finished control unit 1, printed circuit board 8 is inserted into interior 12 of housing 2 in the direction of arrow 11. Rack mount housing seal 10 thus seals rack mount housing 3.

Figure 2:
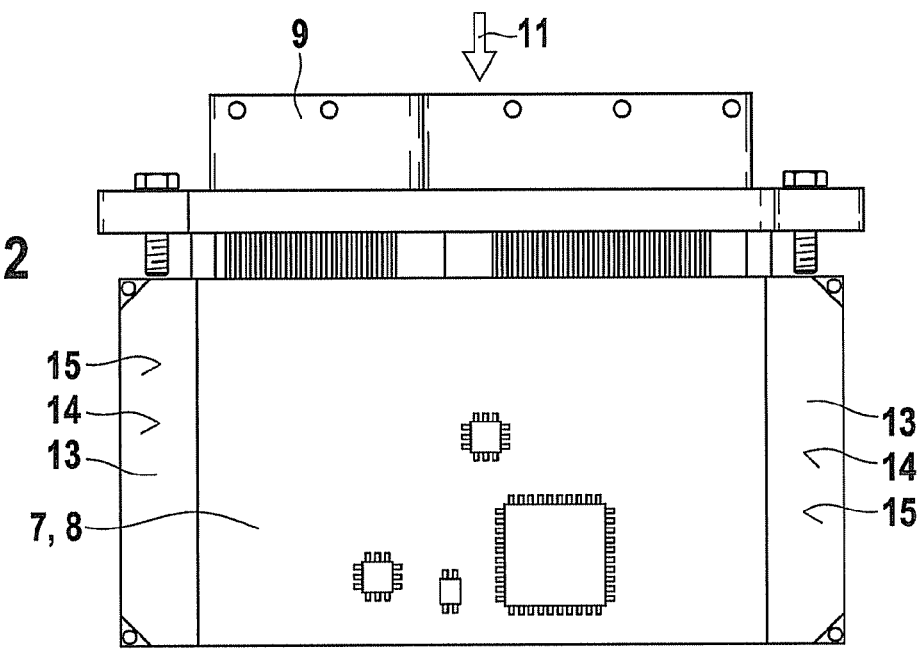
FIG. 2 shows a module in the form of a printed circuit board.

FIG. 2 shows electronic module 7 in the form of printed circuit board 8 from a side which is not visible in FIG. 1. Printed circuit board 8 has two heat dissipating elements 13. Heat dissipating elements 13 are designed as heat conducting flat structures 14, each of which has a large contact surface 15.

Figure 3:
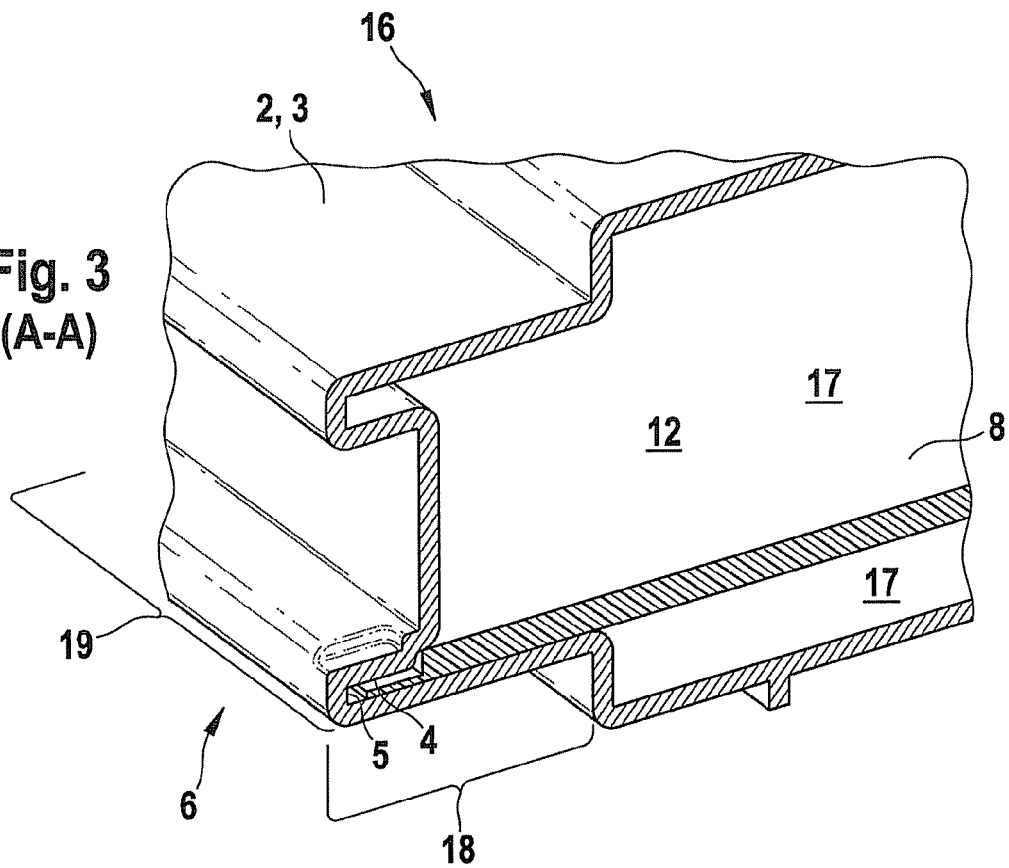
FIG. 3 shows a simplified detail of a cross section of the control unit.

FIG. 3 shows a simplified detail 16 of rack mount housing 3, including inserted printed circuit board 8 in cross section A-A, which is illustrated in FIG. 1. Printed circuit board 8 is thus located within interior 12 of housing 2 and thus in a housing interior 17. Printed circuit board 8 is located on the side in guide 4, which is designed as guide channel 5. Guide channel 5 is formed by a section 6 of rack mount housing 3. Printed circuit board 8 is in physical contact with rack mount housing 3 in a heat dissipating area 18. As a result, guide 4 is located within a zone 19 of heat dissipating area 18.

Figure 4:
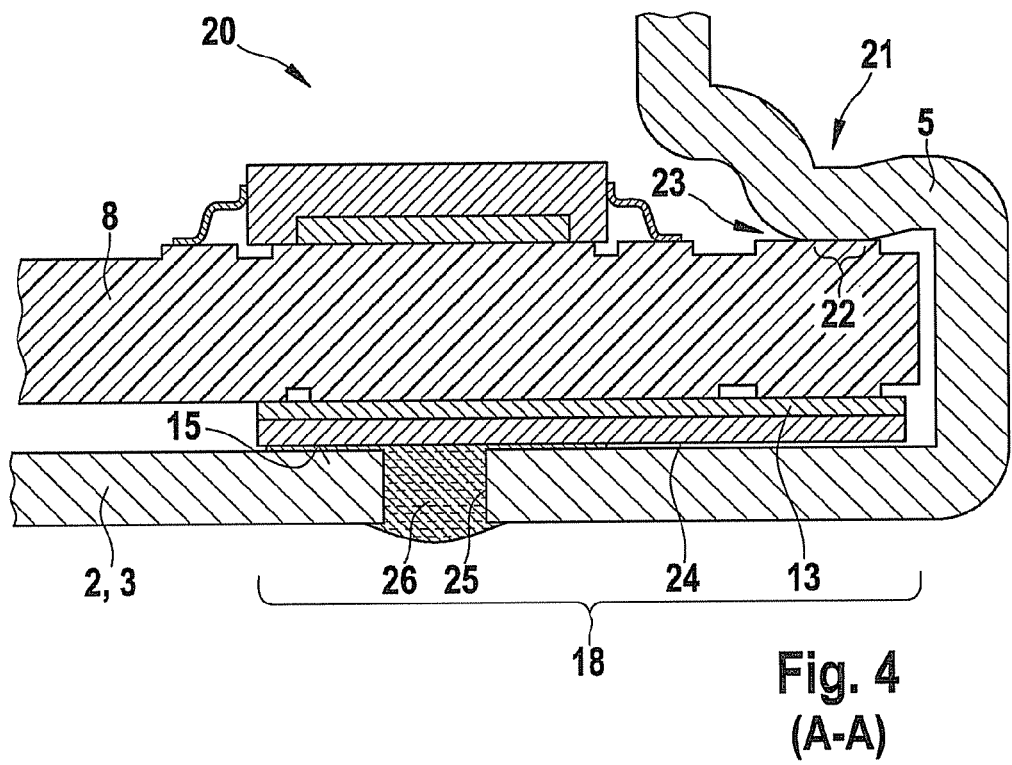
FIG. 4 shows a further detail of the cross section of the control unit, including the introduced heat conducting medium.

FIG. 4 shows a further enlarged detail 20 along section line A-A from FIG. 1. Printed circuit board 8 is in physical contact with rack mount housing 3 via its contact surface 15. Printed circuit board 8 is guided in guide channel 5. The guide channel is provided with an indentation 21, which presses areas of guide channel 5 against printed circuit board 8. This produces a physical contact area 22 between printed circuit board 8 and housing 2. This physical contact area 22 has a gap space 23. Furthermore, a gap space 24 is provided between contact surface 15 and rack mount housing 3 in heat dissipating area 18.

Rack mount housing 3 has a housing opening 25 which extends from gap space 24 through rack mount housing 3 to the outside. A heat conducting medium 26, which fills gap space 24 as well as housing opening 25 and thereby establishes a heat conducting connection, is introduced into housing opening 25.

Indentation 21, which is produced during the manufacture of control unit 1, establishes a permanent contact between contact surface 15 and rack mount housing 3 in heat dissipating area 18. Since gap spaces 23 and 24 are formed due to manufacturing tolerances, optimum heat dissipation does not occur at this point. By filling gap space 24 with heat conducting medium 26, it is possible to optimize heat dissipation from heat dissipating element 13 to rack mount housing 3 via contact surface 15. It is furthermore possible to fill gap space 23 in a similar manner using heat conducting medium 26. It is provided that heat conducting medium 26 is a heat conducting medium 26 which has a paste-like consistency at least when introduced. A paste-like consistency of the heat conducting medium makes it possible to easily introduce heat conducting medium 26 through housing opening 25 into housing interior 17 between heat dissipating element 13 and rack mount housing 3. Subsequent curing of heat conducting medium 26 is conceivable and has the advantages that housing opening 25 is sealed thereby and, in addition, a support is established for printed circuit board 8.

Figure 5:
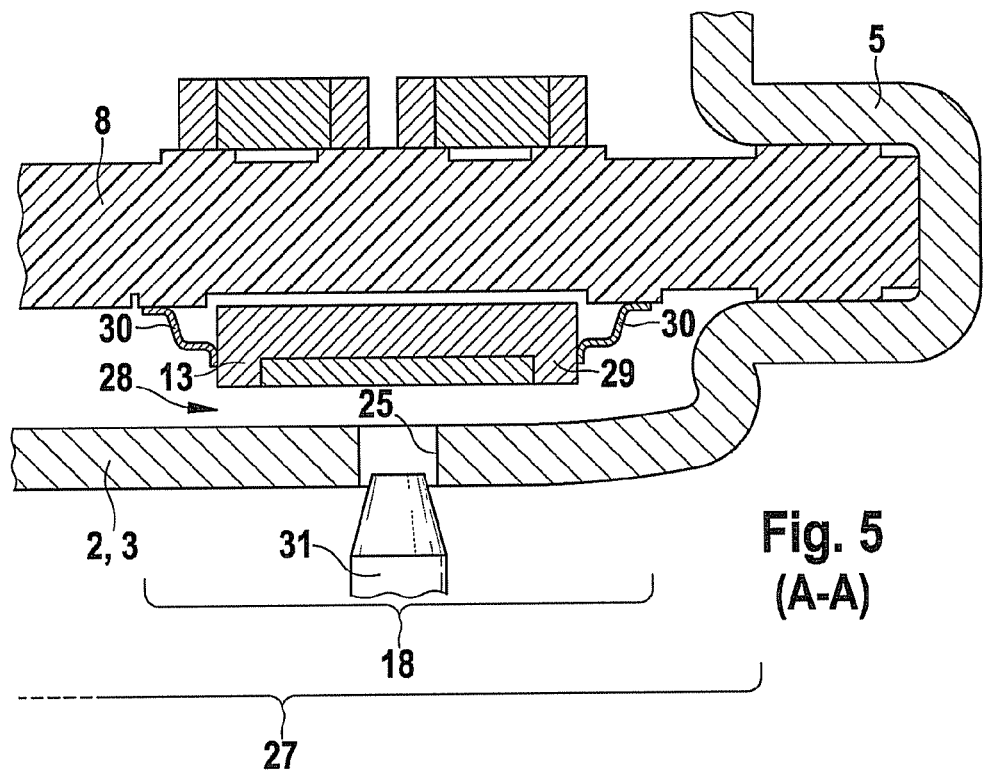
FIG. 5 shows a detail of a cross section of a further control unit before a heat conducting medium is introduced.

FIG. 5 shows a detail of a cross section of a further specific embodiment of rack mount housing 3 in cross section A-A. Rack mount housing 3 has an area 27 which is lower than guide channel 5. As a result, a very large gap space 28 is produced between printed circuit board 8 and housing 2. A heat dissipating element 13 in the form of a slug-up element 29 is attached to printed circuit board 8. Slug-up element 29 is heat conductively connected to printed circuit board 8 via conductors 30. Furthermore, slug-up element 29 is situated between printed circuit board 8 and lowered area 27 of rack mount housing 3. Heat dissipating area 18 is thus also formed for slug-up element 29 on rack mount housing 3. Housing opening 25 is located in a position which is situated centrally relative to slug-up element 29. A dispensing device 31 is indicated at housing opening 25.

Figure 6:
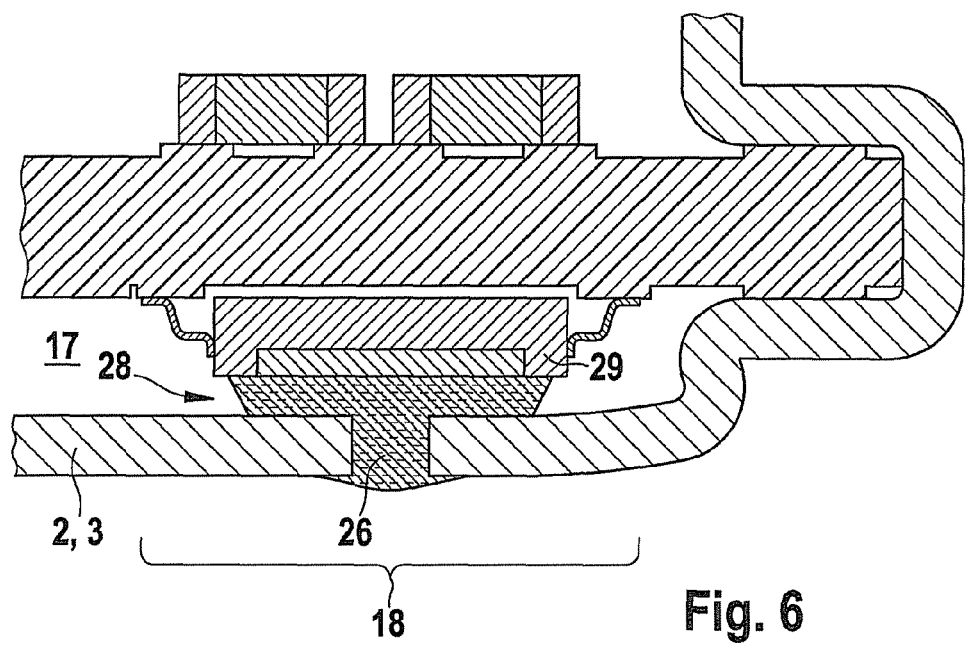
FIG. 6 shows the detail of the cross section of the further control unit after the heat conducting medium has been introduced.

FIG. 6 shows the specific embodiment in FIG. 5, including all its features. In contrast to FIG. 5, gap space 28 in heat dissipating area 18 between slug-up element 29 and rack mount housing 3 is filled with heat conducting medium 26.

Heat conducting medium 26 was introduced into housing interior 17 in a paste-like form through housing opening 26, using dispensing device 31. Heat conducting medium 26 thus connects slug-up element 29 to rack mount housing 3. To seal rack mount housing 3 at housing openings 26, heat conducting medium 26 is cured after being introduced. A highly efficient heat dissipation from printed circuit board 8 to rack mount housing 3 is implemented in the manner illustrated in FIG. 6, it being possible to very easily introduce heat conducting medium 26 during manufacturing.

Figure 7:
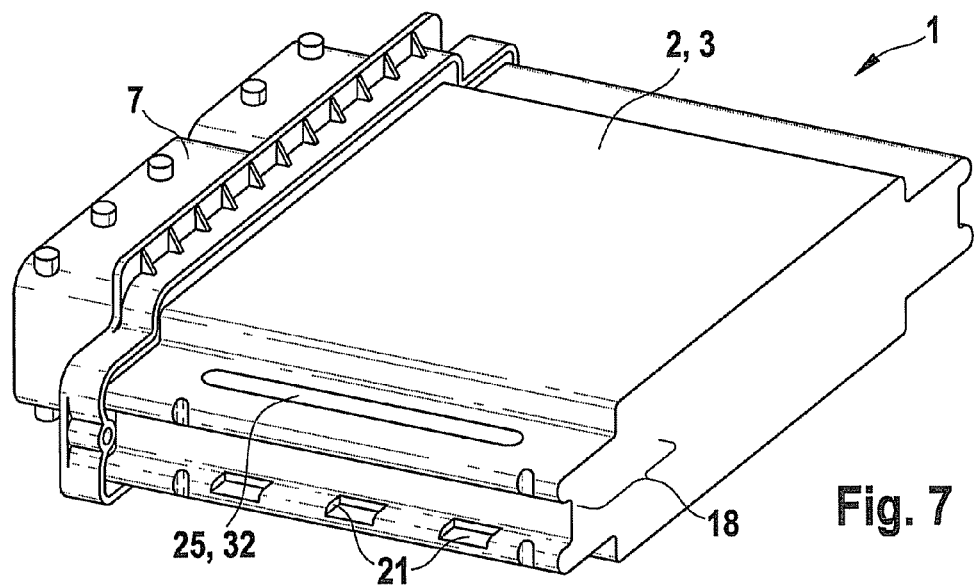
FIG. 7 shows the control unit having a housing opening shaped like an oblong hole.

FIG. 7 shows control unit 1, including rack mount housing 3 and inserted module 7. Housing opening 25 is illustrated in the form of an oblong hole 32 in heat dissipating area 18. Oblong hole 32 makes it possible to very easily and quickly introduce heat conducting medium 26 over a wide area.

Figure 8:
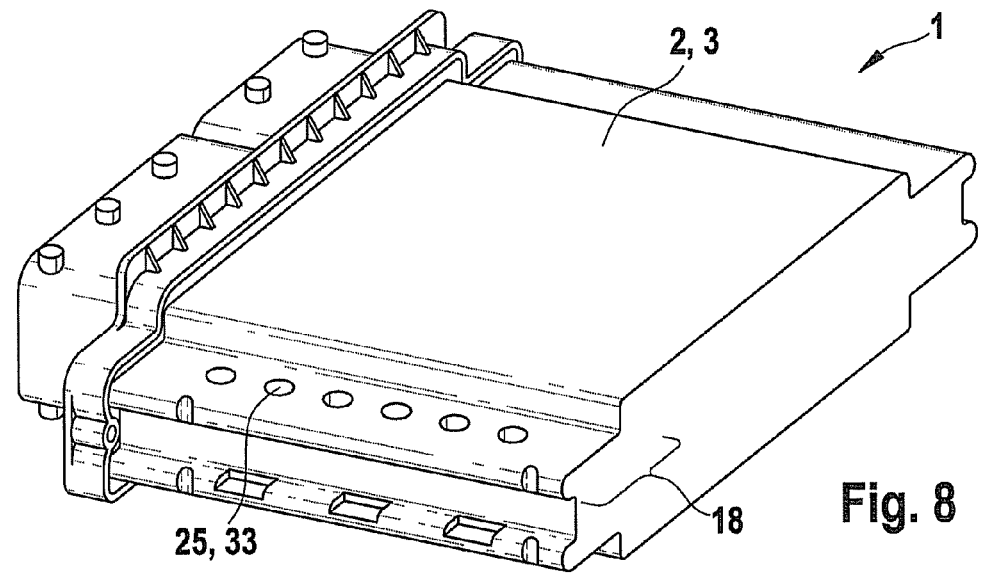
FIG. 8 shows the control unit having multiple circular housing openings.

FIG. 8 shows control unit 1 having rack mount housing 3, a plurality of housing openings 25, each of which is designed as a circular housing opening 33, being situated in heat dissipating area 18.

The present invention provides an example method for manufacturing control unit 1, which may include the following steps:
1. Mounting, for example, SMD components on printed circuit board 8;
2. Soldering the SMD components to printed circuit board 8;
3. Inserting printed circuit board 8 into rack mount housing 3;
4. Introducing heat conducting medium 26 through housing openings 25; and
5. Producing indentations 21 in housing 2 in the area of guide channels 5.

What is claimed is:

1. A control unit for a motor vehicle, comprising:
   a housing which has at least one heat dissipating area;
   at least one electrical or electronic module having at least one heat dissipating element, the module being situated in the heat dissipating area; and
   a heat conducting medium which is introduced into an interior of the housing through at least one housing opening situated in the heat dissipating area, and which has a paste-like consistency at least when introduced, the heat dissipating element being conductively connected to the heat dissipating area via the heat conducting medium, wherein:
   the housing is a rack mount housing into which the module is inserted,
   the control unit has a guide for inserting the module,
   the guide is designed as a guide channel,
   a structure of the guide that forms the guide channel includes as part of the structure at least one indentation for clamping the module on an edge,
   the at least one indentation applies a downward clamping force directly on the module to establish a permanent contact between a contact surface of the module and the rack mount housing in the heat dissipating area,
   the guide channel is a U-shaped space defined by opposing sides of the structure and occupied by the edge of the module,
   the indentation is located in only one of the opposing sides and narrows the guide channel in relation to a remaining portion of the guide channel where the indentation is absent, and
   the clamping occurs at the narrowed location of the guide channel.

2. The control unit as recited in claim 1, wherein the heat conducting medium fills a gap space in the housing interior located between the heat dissipating element and the heat dissipating area.

3. The control unit as recited in claim 1, wherein the heat dissipating element extends into the guide.

4. The control unit as recited in claim 1, wherein the guide is located in a zone of the heat dissipating area.

5. The control unit as recited in claim 1, wherein a section of the housing forms the guide channel.

6. The control unit as recited in claim 1, wherein the module has a printed circuit board which is accommodated in the guide channel.

7. A method for manufacturing a control unit for a motor vehicle, comprising:
   providing a housing, having at least one heat dissipating area;
   situating at least one electrical or electronic module having at least one heat dissipating element in the heat dissipating area;
   introducing a heat conducting medium into an interior of the housing through at least one housing opening situated in the heat dissipating area, the heat conducting medium having a paste-like consistency at least when introduced;
   wherein the heat dissipating element is heat conductively connected to the heat dissipating area via the heat conducting medium, wherein:
   the housing is a rack mount housing into which the module is inserted,
   the control unit has a guide for inserting the module,
   the guide is designed as a guide channel,
   a structure of the guide that forms the guide channel includes as part of the structure at least one indentation for clamping the module on an edge,
   the at least one indentation applies a downward clamping force directly on the module to establish a permanent contact between a contact surface of the module and the rack mount housing in the heat dissipating area,
   the guide channel is a U-shaped space defined by opposing sides of the structure and wide enough to accommodate the edge of the module,
   the indentation is located in only one of the opposing sides and narrows the guide channel in relation to a remaining portion of the guide channel where the indentation is absent, and
   the clamping occurs at the narrowed location of the guide channel.

* * * * *